US008664622B2

(12) United States Patent
Hwang et al.

(10) Patent No.: US 8,664,622 B2
(45) Date of Patent: Mar. 4, 2014

(54) SYSTEM AND METHOD OF ION BEAM SOURCE FOR SEMICONDUCTOR ION IMPLANTATION

(75) Inventors: Chih-Hong Hwang, New Taipei (TW); Chun-Lin Chang, Jhubei (TW); Chi-Ming Yang, Hsinchu (TW); Chin-Hsiang Lin, Hsin-chu (TW); Wen-Yu Ku, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/443,994

(22) Filed: Apr. 11, 2012

(65) Prior Publication Data
US 2013/0270454 A1 Oct. 17, 2013

(51) Int. Cl.
*H01J 27/00* (2006.01)
*A61N 5/00* (2006.01)
*G21G 5/00* (2006.01)

(52) U.S. Cl.
USPC ...... 250/423 R; 250/427; 250/424; 250/492.3

(58) Field of Classification Search
USPC ............................ 250/423 R, 427
See application file for complete search history.

(56) References Cited

U.S. PATENT DOCUMENTS

| | | | | |
|---|---|---|---|---|
| 3,835,319 A * | 9/1974 | Roehrig et al. | | 250/292 |
| 4,017,376 A * | 4/1977 | Mose et al. | | 204/258 |
| 4,945,247 A | 7/1990 | Kawasaki et al. | | |
| 5,592,053 A * | 1/1997 | Fox et al. | | 315/3 |
| 5,804,833 A * | 9/1998 | Stettner et al. | | 257/10 |
| 5,861,707 A * | 1/1999 | Kumar | | 313/309 |
| 5,905,330 A * | 5/1999 | Imura | | 313/336 |
| 5,929,827 A * | 7/1999 | Isono et al. | | 345/74.1 |
| 5,989,976 A * | 11/1999 | Liao | | 438/424 |
| 6,255,772 B1 * | 7/2001 | Cathey et al. | | 313/495 |
| 6,269,765 B1 * | 8/2001 | Chu et al. | | 118/723 I |
| 6,522,080 B1 * | 2/2003 | Faillon et al. | | 315/169.3 |
| 6,629,869 B1 * | 10/2003 | Kumar et al. | | 445/24 |
| 6,878,476 B2 * | 4/2005 | DeAngelis et al. | | 429/465 |
| 6,918,351 B2 | 7/2005 | Chen et al. | | |
| 7,449,090 B2 * | 11/2008 | Andrews et al. | | 204/225 |
| 7,626,326 B2 * | 12/2009 | Jeon et al. | | 313/496 |
| 7,826,594 B2 * | 11/2010 | Zou et al. | | 378/92 |
| 7,860,219 B2 * | 12/2010 | Clark et al. | | 378/136 |
| 7,938,707 B1 * | 5/2011 | Walker et al. | | 445/23 |

(Continued)

FOREIGN PATENT DOCUMENTS

KR 100584791 B1 5/2006
KR 10-2009-0009975 1/2009

OTHER PUBLICATIONS

Tsai, C.H. et al., "Nanogap Formation by Palladium Hydrogenation for Surface Conduction Electron Emitters Fabrication", Appl. Phys. Lett., 2007, 90:163115-1 through 3.

(Continued)

*Primary Examiner* — Jack Berman
*Assistant Examiner* — Sean Luck
(74) *Attorney, Agent, or Firm* — Duane Morris LLP

(57) ABSTRACT

An apparatus comprises an ionization chamber for providing ions during a process of ion implantation, and an electron beam source device inside the ionization chamber. The electron beam source device comprises a field emission array having a plurality of emitters for generating electrons in vacuum under an electric field.

20 Claims, 7 Drawing Sheets

(56) References Cited

U.S. PATENT DOCUMENTS

| | | | |
|---|---|---|---|
| 8,154,210 B2* | 4/2012 | Horsky et al. | 315/111.81 |
| 2003/0020059 A1* | 1/2003 | Komoda et al. | 257/10 |
| 2006/0125370 A1* | 6/2006 | Nishimura et al. | 313/310 |
| 2006/0189244 A1* | 8/2006 | Cathey et al. | 445/25 |
| 2007/0278417 A1* | 12/2007 | Horsky et al. | 250/427 |
| 2008/0116446 A1* | 5/2008 | Yamamoto et al. | 257/10 |
| 2009/0203199 A1 | 8/2009 | Ishikawa et al. | |
| 2009/0252889 A1* | 10/2009 | Chao et al. | 427/528 |
| 2010/0051964 A1* | 3/2010 | Lin et al. | 257/77 |
| 2010/0140077 A1 | 6/2010 | Koo et al. | |

OTHER PUBLICATIONS

"Field Emitter Array", from Wikipedia, found at http://en.wikipedia.orglwiki/Field_emitter_array, 2 pages.

"Hot Cathode", from Wikipedia, found at http://en.wikipedia.org/wiki/Hot_cathode, 5 pages.

"Field Electron Emission", from Wikipedia, found at http://en.wikipedia.org/wiki/Field_electron_emission, 31 pages.

Lo, H.Y. et al., "Analysis of Field Emission of Fabricated Nanogap in Pd Strips for Surface Conduction Electron-Emitter Displays", Japanese Journal of Applied Physics, 2008, 47(4):2972-2976.

Lo, H.Y. et al., "Field-emission properties of novel palladium nanogaps for surface conduction electron-emitters", Nanotechnology, 2007, 18, 7 pages.

Cheng, Y. et al., "Electron field emission from carbon nanotubes", C.R. Physique, 2003, 4:1021-1033.

Official Action issued Aug. 29, 2013, in counterpart Korean Patent Application No. 10-2012-0072262.

* cited by examiner

US 8,664,622 B2

SYSTEM AND METHOD OF ION BEAM SOURCE FOR SEMICONDUCTOR ION IMPLANTATION

FIELD

The disclosed system and method relate to semiconductor processing. More particularly, the disclosed subject matter relates to an ion beam source system for use in ion implantation equipment in the process of doping semiconductors.

BACKGROUND

Ion implantation is commonly used for doping a semiconductor material at precisely controlled depths and dopant concentrations. An ion implanter generally includes an ion source to generate an ion beam, ion beam transport optics for accelerating the ion beam, and a process chamber where the ion implantation on a semiconductor wafer occurs. The ions are mostly positively charged.

An ion beam containing dopants is generated in an ion beam source chamber. Thermionic electrons are first generated from a metal such as tungsten filament which is heated by a current source. The filament is also negative biased. Thermionic electrons are generally accelerated by the biased potential, and collide with molecules of dopant precursors to generate plasma comprising dopant ions.

During ion implantation, the charged ion beam strikes the semiconductor wafers in the process chamber, resulting in a doped semiconductor wafer when the dopant ions diffuse into the wafer.

Meanwhile, the size of semiconductor wafers has gradually increased to improve throughput and reduce cost per die. For example, in the transition from 300 mm to 450 mm wafer size, the wafer area increases by 125%. The within wafer uniformity (WiWU) becomes more difficult to maintain in the more-than-double-sized wafer.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout specification and drawing.

DETAILED DESCRIPTION

Figure 1A:
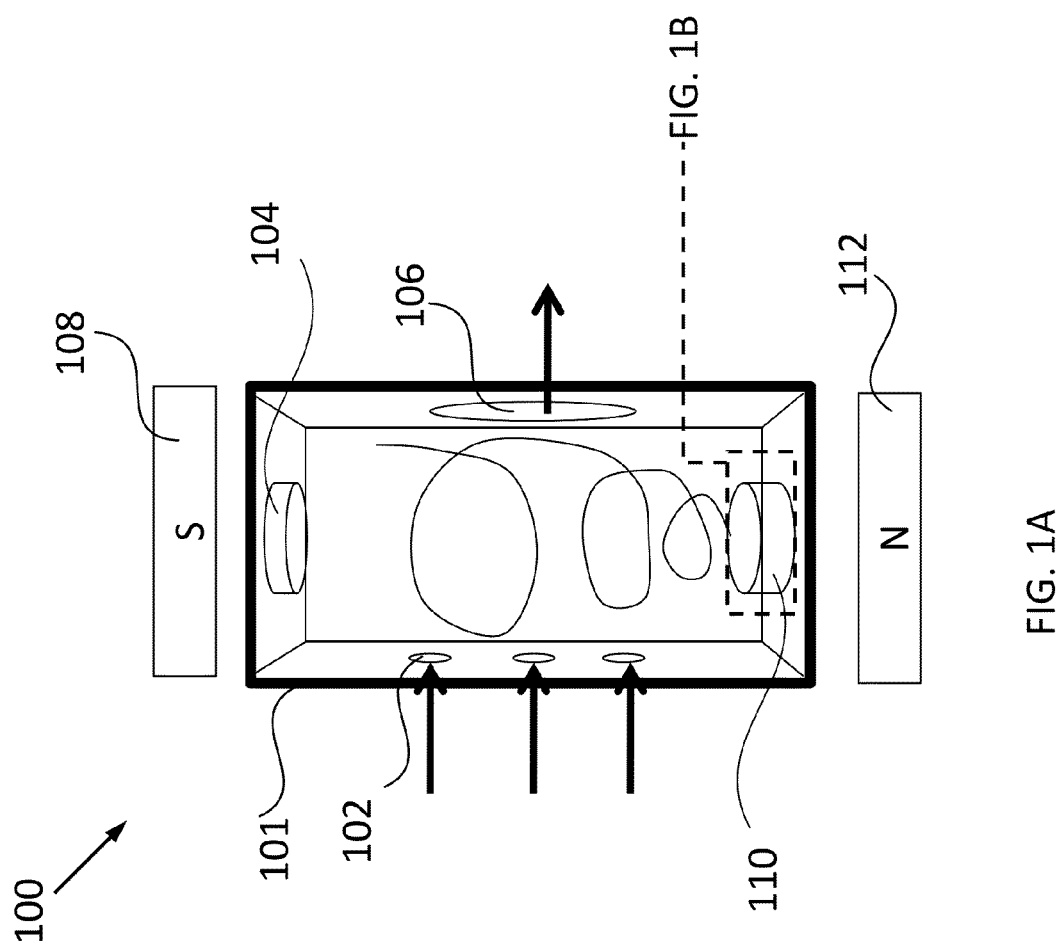
FIG. 1A illustrates an exemplary ionization chamber system having an electron beam source device comprising a field emission array, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In an ion implantation process, the improved productivity becomes more beneficial when the wafer size increases. For example, in the transition from 300 mm to 450 mm wafer size, the ion beam is used to implant the more-than-double-sized wafer for a uniform ion implantation.

The inventors have determined that the ion beam current is a contributor to the productivity. Higher ion beam current provides a more efficient doping and an improved productivity when the wafer size increases. For example, compared to that for the 300 mm wafers, a higher ion beam current is used to increase productivity in an ion implantation platform for the 450 mm wafers. The magnitude of ion beam current affects within-wafer uniformity (WiWU).

The inventors have also determined that the filament based electron source device in some ion source chambers can limit thermionic electrons, resulting in limited amount of ions in an ion beam. The lifetime of the filament in the ion beam source chamber also ultimately affects the wafer yield. So in some embodiments described herein, such ion beam current can be increased in the ion implantation platform, which is useful for the larger wafers, as well as smaller wafers.

An ion generation apparatus having an electron beam source device comprising a field emission array, a related ion implantation equipment system, and an ion generation method are provided to increase the ion beam current during a process of ion implantation. The increased ion beam current results in an increase in the rate of doping through an ion implantation, and an overall increase in productivity.

In some embodiments, an apparatus comprises an ionization chamber, and an electron beam source device inside the ionization chamber. Such an electron beam source device comprises a field emission array having a plurality of emitters for generating electrons in vacuum under an electric field. In some embodiments, the electron source device further comprises a cathode. The cathode is configured so that the electrons from the field emission array collide with the cathode, and the cathode is configured to emit secondary electrons. The electrons collide with the at least one dopant gas inside the ionization chamber to ionize the dopant molecules to generate plasma. The plasma comprises dopant ions, which are extracted through an extraction apparatus to form an ion beam.

For brevity and clarification, references to "secondary electrons" made below will be understood to encompass the electrons emitted from a cathode after the electrons emitted from a field emission array are directed toward the cathode. References to electrons for ionizing dopant gas made below will be understood to encompass the electrons from the cathode and from the field emission array, unless expressly indicated otherwise.

Figure 1B:
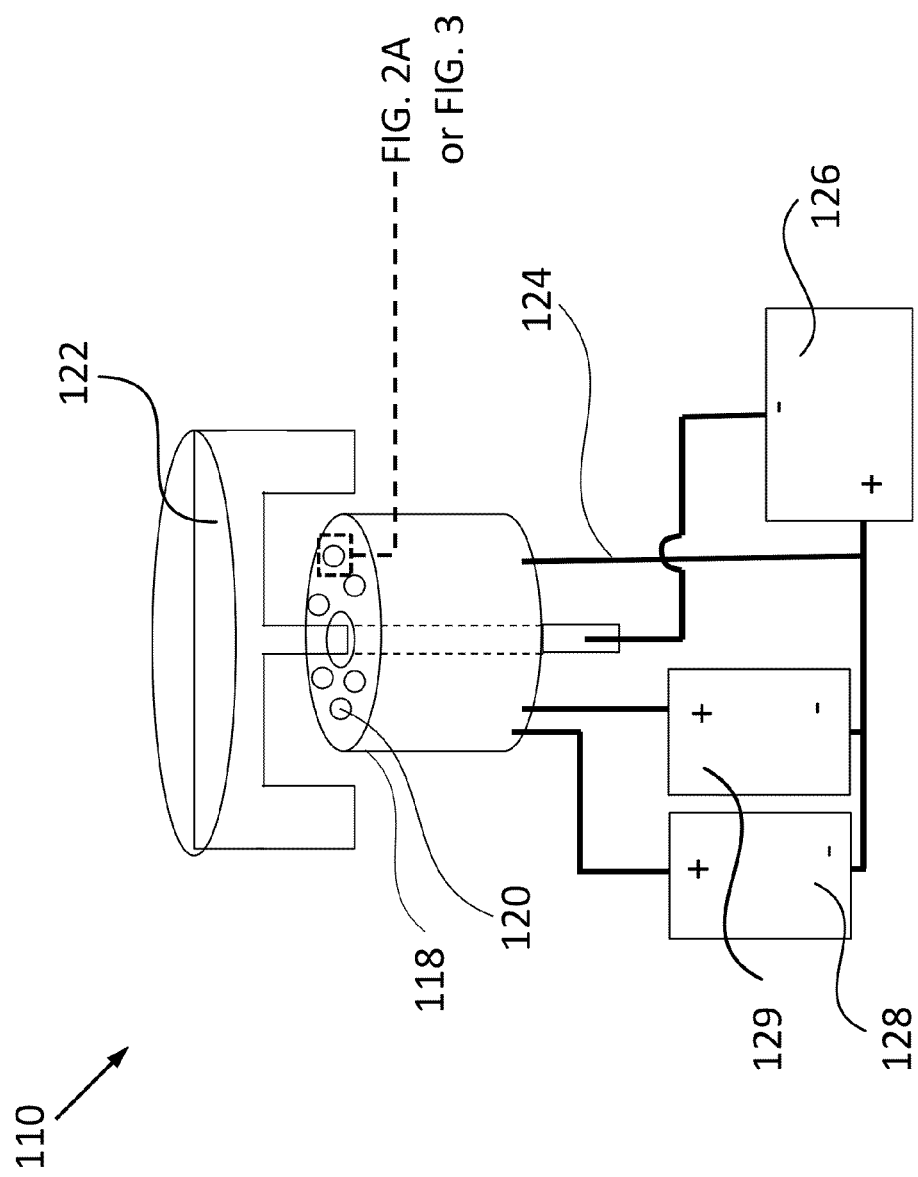
FIG. 1B is an enlarged detail of an exemplary electron beam source device in FIG. 1A, in accordance with some embodiments.

FIG. 1A illustrates an exemplary ionization chamber system 100 having an electron beam source device 110 comprising a field emission array, in accordance with some embodiments. FIG. 1B is an enlarged detail of an exemplary electron beam source device 110 in FIG. 1A, in accordance with some embodiments.

Ionization chamber system 100 comprises an ionization chamber 101, an electron beam source device 110 inside ionization chamber 101, at least one inlet 102 for feeding dopant gas on a first wall of chamber 101, a repeller 104 inside chamber 101, and at least one outlet or aperture 106 for ionized dopant on a second wall of chamber 101. Two magnets 108 and 112 are installed outside chamber 101 at the two ends, and aligned with repeller 104 and electron beam source 110 in the same direction.

Inlet 102 is used to supply a dopant gas into ionization chamber 110. Examples of dopants include but are not limited to $BF_3$, $PH_3$, $AsH_3$ and any other dopant precursors suitable for doping a semiconductor wafer. The starting material for dopant gas is in the form of gas, liquid or solid. In some embodiments, solid dopants are vaporized at a raised temperature such as 200° C. or higher, or decomposed at an elevated temperature such as 800° C. or higher. In some embodiments, dopants are introduced with another gas. Examples of the other gas to be introduced with the dopants include but are not limited to nitrogen, argon, oxygen and hydrogen.

Electron source device 110 generates and emits electrons inside the ionization chamber 100. An exemplary electron source device 110 is described in details below with reference to FIG. 1B.

Repeller 104 is located inside chamber 101, but at the end opposite to electron source device 110. Repeller 104 serves to confine electrons inside chamber 101 and reflect them back toward electron source device 110.

Magnets 108 and 112 create a magnetic field so that the electrons from electron source device 110 travel forward in a spiral direction toward repeller 104. Magnets 108 and 102, together with repeller 104 are configured so that the electrons from electron source device 110 travel repeatedly in helical paths, and efficiently collide with dopant molecules. The dopant molecules are ionized to form plasma comprising dopant ions, radicals and other species. For example, $AsH_3$ molecules struck by electrons produce ions such as $As^+$, $As_2^+$ and $AsH_2^+$.

Outlet or aperture 106 is located on a second wall of chamber 101. In some embodiments, aperture 106 is located on the side opposite to that for inlet 102 for dopant gas. Aperture 106 provides an exit pathway for dopant ions from chamber 101.

An ion extraction apparatus having electrodes is used to extract the desired dopant ions based on electric charges. The dopant ions are further accelerated to form an ion beam. Such ion beam is used to dope a semiconductor wafer in the ion implantation system.

Referring to FIG. 1B, an exemplary electron source device 110 comprises a field emission array 118, in accordance with some embodiments. A field emission array comprises a plurality of emitters 120 for generating electrons in vacuum under an electric field.

Electron source device 110 comprises a field emission array 118, and two power sources 128 and 129. They are connected with conductor wires 124. In some embodiments, electron source device 110 further comprises a cathode 122 and a third power supply 126. In some embodiments, field emission array 118 and cathode 122 are in a vacuum chamber.

Field emission array 118 comprises a plurality of emitters 120 on its top surface. Field emission array 118 is in a rod or tubular shape. In some embodiments, the cross-section shape of field emission array 118 is a circle, a square, or any other regular polygon. In some embodiments, the top surface of field emission array 118 has a shape of a circle, a square, or any other regular polygon. The plurality of emitters 120 are arranged in any pattern on the top surface of field emission array 118. In some embodiments, field emission array 118 contains an opening or a hole in its middle portion. A portion of cathode 122 goes through field emission array 118 having such an opening or hole, in a direction normal to the top surface of field emission array 118. Cathode 122 is not electrically connected with any part of field emission array 118.

Each of the plurality of emitters 120 generates electrons in vacuum under an electric field. Examples of an emitter in field emission array 118 include but are not limited to a nanogap device, a carbon nanotube based device, and a Spindt array structure. Emitters 120 may be prepared on a substrate by lithographic techniques similar to those used in the fabrication of integrated circuits. The plurality of similar or identical individual emitters is organized in a regular two-dimensional pattern to provide field emission array 118.

Figure 2A:
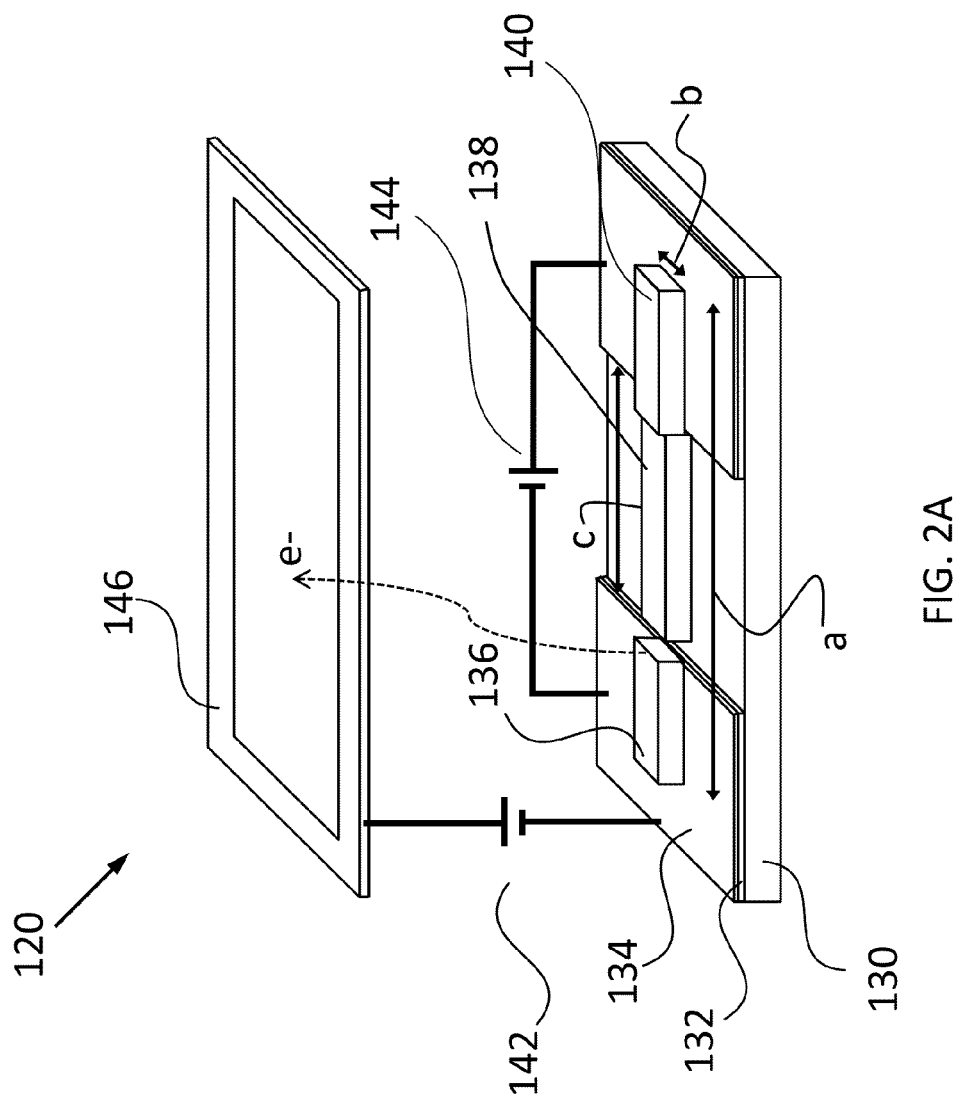
FIG. 2A illustrates an exemplary emitter in a field emission array, which is a metal nanogap device, in accordance with some embodiments.
Figure 2B:
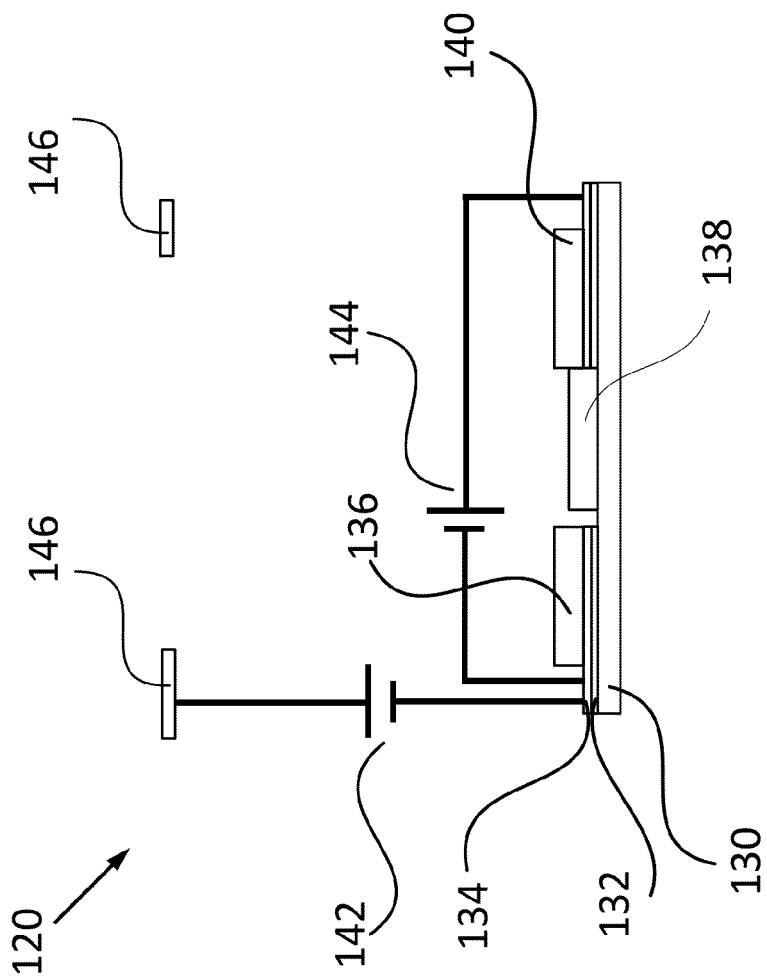
FIG. 2B is a cross section view of the exemplary emitter in FIG. 2A.

FIG. 2A illustrates an exemplary emitter 120, which is a metal nanogap device, in accordance with some embodiments. FIG. 2B is a cross section view of the exemplary emitter in FIG. 2A. Exemplary emitter 120 is one of the plurality of emitters in field emission array 118 shown in FIG. 1B. Field emission array 118 having such exemplary emitters 120 is fabricated by lithographic techniques used in semiconductor industry.

In some embodiments substrate 130 is a silicon wafer having a layer of $SiO_2$ deposited or grown on the surface. In some embodiments, the thickness of the $SiO_2$ layer on the silicon wafer ranges from 10-300 nm.

Different metal layers 132, 134 and 136 are disposed over substrate 130 to form a nanogap structure as illustrated in FIGS. 2A and 2B. In some embodiments, for example, metal layer 132 is titanium. Titanium (Ti) layer 132 can be deposited by electron beam evaporation, physical vapor deposition (PVD), chemical vapor deposition (CVD) or any other coating method. In some embodiments, titanium layer 132 is 1-100 nm in thickness. For example, the thickness of titanium layer 132 is 5 nm in one embodiment.

Metal layer 134 is disposed over metal layer 132. In some embodiments, metal layer 134 is a different metal of 1-100 nm in thickness. In some embodiments, for example, metal layer 134 is a 10 nm thick platinum layer. Platinum (Pt) layer 134 can be deposited by electron beam evaporation, PVD, CVD or any other coating method.

Metal strips 136, 138 and 140 are disposed over the substrate after formation of gaps through lithographically etching metal layers 132 and 134. The gap dimension ranges from 1 to 200 microns. Strip 138 is disposed inside the gap over the substrate, while strips 136 and 140 are disposed on metal layers 132 and 134 coated substrate.

In some embodiments, metal strips 136, 138 and 140 are of the same metal as each other. In some embodiments, for example, they are made of palladium (Pd). In some embodiments, a sharp edge on these metal strips, particularly on metal strip 136 at the edge facing metal strips 138 and 140, is preferred. In some embodiments, the metal strips go through high pressure hydrogen treatment. For example, upon hydrogen absorption, a palladium metal strip goes through phase transformation leading to volume expansion. The resulting high stress concentration leads to formation of a nanogap having sharp edges.

For illustration purpose, related dimensions are labeled in FIG. 2A. In some embodiments, for example, the total width (a) of metal strips 136, 138 and 140 is about 50 μm in a direction perpendicular to the gap direction, while the dimension along the gap direction (b) is about 3 μm. The width of the gap (c) is about 15 μm. The dimensions of a nanogap based device are not limited by any of these values demonstrated in this disclosure.

Metal strip 140 and metal layers 134 and 132 underneath forms a gate structure. Metal strip 136 having an edge and metal layers 134 and 132 underneath form a cathode array structure. As illustrated in FIG. 2A, a gate voltage (Vg) from a DC power source is applied between the gate structure and the cathode array structure through a DC power source 144 in the device. Vg is in a range of from 10 to 2000 volts. Under a high electric field in vacuum, electrons are emitted from the edge of metal strip 136.

In some embodiments, the cathode array structure comprising metal strip 136, and metal layers 132 and 134 underneath, is also connected to a ring-shaped anode 146 above the nanogap device. As shown in FIG. 2A, they are connected through a DC power source 142 at a voltage in the range of 1,500-3,500 volts. The electrons emitted from the edge of metal strip 136 are accelerated under such electric field and travel through the opening in the middle portion of the anode 146.

FIG. 2B is a cross section view of the exemplary emitter in FIG. 2A, which is a nanogap device. In FIG. 2B, the same items are indicated by the same reference numerals, and for brevity, descriptions of the structure, provided above with reference to FIG. 2A, are not repeated.

Figure 3A:
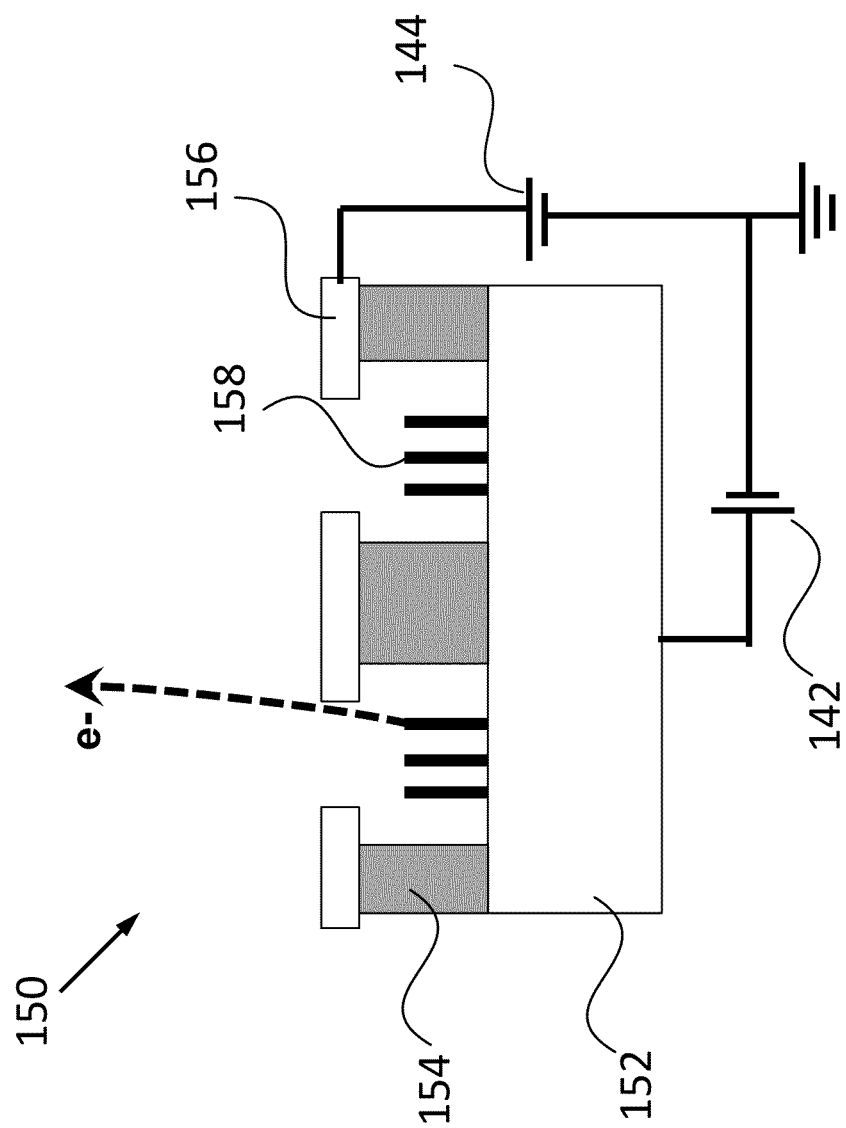
FIG. 3A illustrates an exemplary emitter in a field mission array, which is carbon nanotube based device, in accordance with some embodiments.

FIG. 3A illustrates an exemplary emitter 150 in a field mission array, which is carbon nanotube based device, in accordance with some embodiments. An emitter 150 comprises at least one carbon nanotube disposed in a void in a dielectric film/layer. Emitter 150 shown in FIG. 3A is one of the type of emitter 120 shown in FIG. 1B.

Emitter 150 in field emission array 118 can be fabricated by lithography, etching and deposition techniques used in the semiconductor industry.

In some embodiments substrate 152 is a silicon wafer. In some embodiments a layer of dielectric material 154 such as $SiO_2$ is deposited or grown on the surface. In some embodiments, the thickness of the $SiO_2$ layer on the silicon wafer ranges from 1-50 μm.

A metal layer 156 is disposed on dielectric layer 154. In some embodiment, layer 156 is silver, titanium, or any other metal, or a combination thereof. In some embodiments, metal layer 156 is deposited by electron beam evaporation, PVD, CVD or any other coating. Through lithographic techniques, layer 154 and 156 are etched to form void spaces in a certain pattern as shown in FIG. 3A.

Carbon nanotubes 158 are grown from substrate 152 inside the void spaces in dielectric layer 154. In some embodiments, carbon nanotubes (CNTs) 158 are single walled CNTs, double walled CNTs 15 or multiple walled CNTs. In some embodiments, all CNTs are aligned in the same direction. In some embodiments, all CNTs are aligned perpendicularly to the substrate.

A gate voltage through power 142 and an anode voltage through power 144 are applied onto the substrate 152 and metal layer 156, as shown in FIG. 3A. In some embodiments, the gate voltage is in the range of 0-1 KV. In some embodiments, the anode voltage is in the range of 0-10 KV. In some embodiments, the anode voltage is higher than the gate voltage. Electrons are emitted from CNTs 158 under such an electric field. Electrons emitted from CNTs are accelerated to travel away from the void space.

Examples of an emitter useful for this purpose are not limited to the nanogap and carbon nanotube based devices described above. In some embodiments, each of the plurality of 25 emitters in the field emission array is a Spindt array structure. The Spindt array structure comprises a plurality of metal cones, each of which is disposed in a respective cylindrical void in a dielectric film.

Figure 3B:
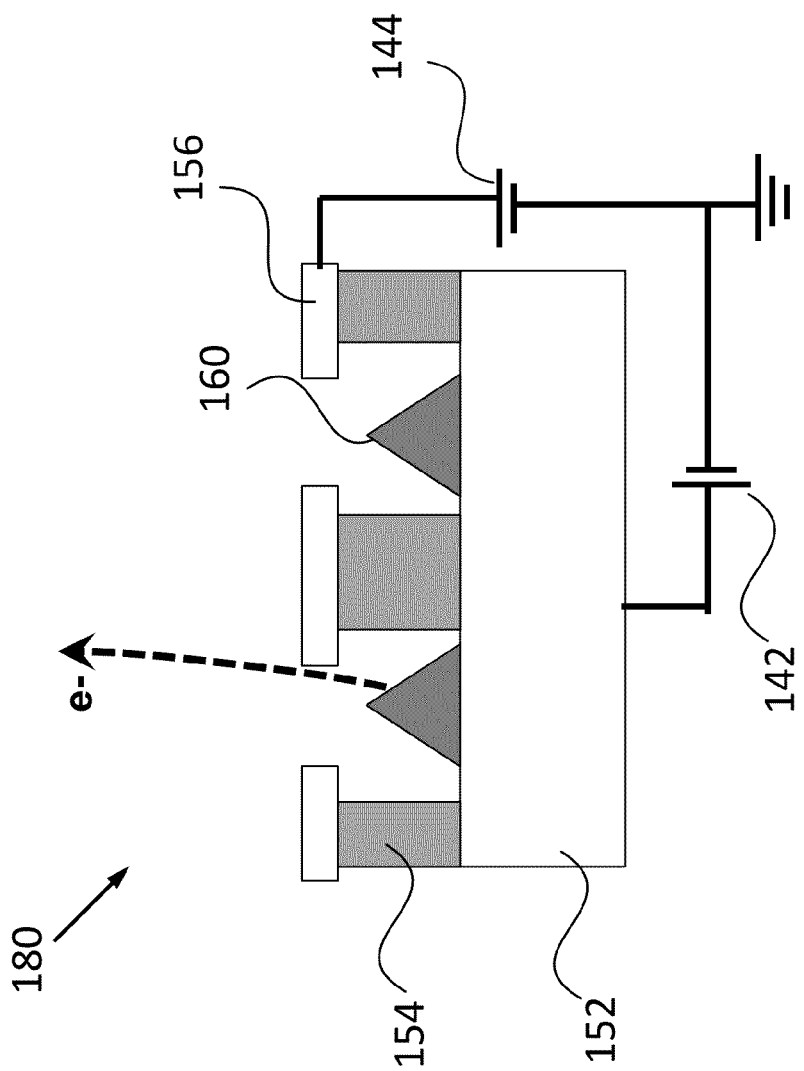
FIG. 3B illustrates an exemplary emitter in a field mission array, which is a Spindt array structure, in accordance with some embodiments.

FIG. 3B illustrates an exemplary emitter in a field mission array, which is a Spindt array structure, in accordance with some embodiments. Emitter 180 shown in FIG. 3B is one of the type of emitter 120 shown in FIG. 1B. In FIG. 3B, like items are indicated by like reference numerals, and for brevity, descriptions of the structure, provided above with reference to FIG. 3A, are not repeated.

In FIG. 3B, electrons are emitted from a plurality of metal cones 160. Each of the plurality of metal cones is disposed in a respective cylindrical void on a dielectric film 154 coated on substrate 152. Metal layer 156 is disposed onto the dielectric film 154. In some embodiments, metal cones 160 as individual field emitters are small sharp molybdenum cones.

A gate voltage through power 142 and an anode voltage through power 144 are applied onto substrate 152 and metal layer 156, as shown in FIG. 3B. In some embodiments, the gate voltage is in the range of 0-1 KV. In some embodiments, the anode voltage is in the range of 0-10 KV. The anode voltage is higher than the gate voltage. Electrons are emitted from metal cones 160 under such an electric field. Electrons emitted from metal cones are accelerated to travel away from the void space.

Referring back to FIG. 1B showing an exemplary electron source device 110, a field emission array 118 comprising a plurality of emitters 120 emits electrons in vacuum under an electrical field.

Power source 128 provides DC power for the gate voltage (Vg) in each emitter 120 as described in FIG. 2A. Power source 129 provides DC power for the anode voltage (Va) in each emitters 120 as described in FIG. 2A. Power sources 128 and 129 are batteries in some embodiments.

Cathode 122 in FIG. 1B is a metal film. In some embodiments, cathode 122 is made of tungsten. Cathode 122 is biased at a voltage from a DC supplier 126. The biased voltage is in the range of 1000-3000 volts. For example, the voltage is 2000 volt in some embodiments.

Cathode 122 and field emission array 118 are configured so that electrons emitted from emitters 120 are accelerated to strike cathode 122. Cathode 122 then emits secondary electrons. The secondary electrons and possibly electrons from emitters are released into ionization chamber 101 in FIG. 1A to produce plasma comprising dopant ions.

Figure 4:
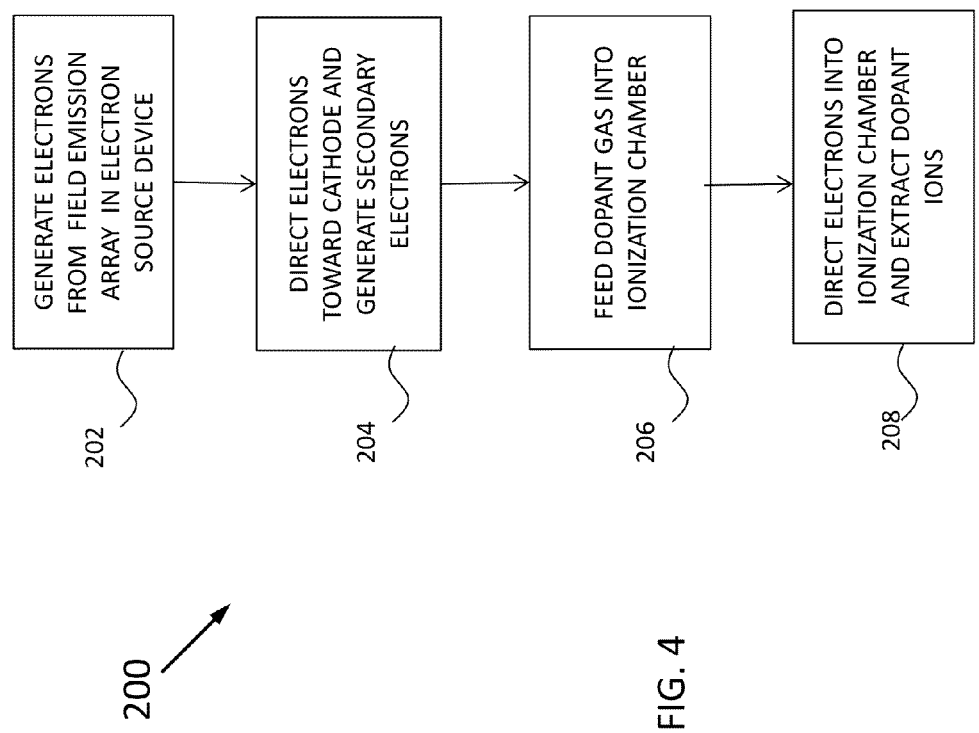
FIG. 4 is a flow chart diagram illustrating an exemplary ion generation method comprising steps of generating electrons from a field emission array and ionizing dopant molecules to form an ion beam for ion implantation, in accordance with some embodiments.

FIG. 4 is a flow chart diagram illustrating an exemplary ion generation method 200 comprising steps of generating electrons from a field emission array and ionizing dopant molecules to form an ion beam for ion implantation, in accordance with some embodiments.

In step 202, electrons are generated from the emitters 120 of a field emission array 118 in an electron source device 110 as described in FIGS. 2A and 3.

In step 204, electrons from the emitters 120 are accelerated and directed toward a cathode 122 in the electron source device 110 as described in FIG. 1B. Electrons from the emitters of the field emission array strike cathode 122 which emit secondary electrons.

In step 206, a gas comprising at least one dopant is fed into the ionization chamber 101 as described in FIG. 1A. The dopant gas comprises a desired dopant precursor. In some embodiments, it also comprises another gas including but not limited to nitrogen, argon, oxygen and hydrogen.

In step 208, electrons emitted from electron source device 110 are released into ionization chamber 101 as described in FIGS. 1A and 1B. Dopant molecules are ionized by the electrons to form plasma comprising dopant ions. The dopant ions are extracted by an extraction apparatus connected with ionization chamber 101. An ion beam comprising dopant ions is formed. The ion beam is used in a process of ion implantation to dope a semiconductor wafer.

The disclosure provides an ion generation apparatus having an electron beam source device comprising a field emission array, a related ion implantation equipment system, and an ion generation method to increase the ion beam current during a process of ion implantation.

In some embodiments, an apparatus comprises an ionization chamber, and an electron beam source device inside the ionization chamber. The electron beam source device comprises a field emission array having a plurality of emitters for generating electrons in vacuum under an electric field.

In some embodiments, the field emission array has a cross-section shape or a top surface selected from a group consisting of a circle, a square and a regular polygon.

In some embodiments, each of the plurality of emitters in the field emission array is a device based on a nanogap of at least one metal. The nanogap device is disposed on a dielectric film.

In some other embodiments, each emitter in the field emission array is a carbon nanotube based device. An emitter comprises at least one carbon nanotube disposed in a void on a dielectric film.

In some embodiments, each of the plurality of emitters in the field emission array is a Spindt array structure. The Spindt array structure comprises a plurality of metal cones, each of which is disposed in a respective cylindrical void on a dielectric film.

In some embodiments, the electron source device inside the ionization chamber further comprises a cathode. The cathode is so configured that the electrons from the field emission array collide with the cathode, and the cathode is configured to emit secondary electrons.

In some embodiments, the ionization chamber is adapted to receive at least one dopant gas. The ionization chamber is so configured that the electrons emitted from the field emission array and the electrons emitted from the cathode collide with the at least one dopant gas to ionize the dopant molecules to generate plasma. The plasma comprises dopant ions.

In some embodiments, the ion source apparatus further comprises an extraction apparatus for extracting the ionized dopants and forming an ion beam for ion implantation. The extraction apparatus is connected with the ionization chamber.

In some embodiments, an ion implantation equipment system comprises an ion source apparatus for generating an ion beam during a process of ion implantation. Such ion source apparatus comprises an ionization chamber configured to receive at least one dopant gas, and an electron beam source device inside the ionization chamber. The electron beam source device comprises a field emission array having a plurality of emitters for generating electrons in vacuum under an electric field.

In some embodiments, the field emission array in an ion implantation equipment system has a cross-section shape or a top surface selected from a group consisting of a circle, a square and a regular polygon.

In some embodiments, each of the plurality of emitters in the field emission array in an ion implantation equipment system is a nanogap of at least one metal disposed on a dielectric film.

In some other embodiments, each of the plurality of emitters in the field emission array in an ion implantation equipment system comprises at least one carbon nanotube disposed in a void on a dielectric film.

In some other embodiments, each of the plurality of emitters in the field emission array an ion implantation equipment system is a Spindt array structure. Such Spindt array structure comprises a metal cone disposed in a cylindrical void on a dielectric film.

In some embodiments, an ion implantation equipment system further comprises a cathode inside the electron beam source device. The cathode is configured so that during use the electrons from the field emission array collide with the cathode, and the cathode emits secondary electrons.

In some embodiments, the field emission array and cathode in an ion implantation equipment system are configured so that during use electrons emitted from the field emission array and the secondary electrons emitted from the cathode collide with the at least one dopant gas for generating plasma comprising ionized dopants.

In some embodiments, the ion implantation equipment system further comprises an extraction apparatus for extracting the ionized dopants and forming an ion beam for ion implantation. The extraction apparatus is connected with the ionization chamber.

In some embodiments, an ion generation method in a process of ion implantation, comprises generating electrons from an electron beam source device comprising a field emission array having a plurality of emitters in vacuum under an electric field. In such method, at least one dopant gas is fed into an ionization chamber. Electrons collide with and ionize the dopant molecules to generate plasma comprising dopant ions.

In some embodiments, the ion generation method further comprises generating secondary electrons from a cathode in the electron beam source device. The electrons emitted from the field emission array are directed toward the cathode. Secondary electrons are emitted from the cathode. The electrons from the cathode collide with and ionize the dopant molecules. Plasma comprising dopant ions are generated. Such dopant ions are extracted to form an ion beam.

Although the subject matter has been described in terms of exemplary embodiments, it is not limited thereto. Rather, the appended claims should be construed broadly, to include other variants and embodiments, which may be made by those skilled in the art.

What is claimed is:

1. An apparatus, comprising:
   an ionization chamber for providing ions during a process of ion implantation; and
   an electron beam source device inside the ionization chamber, the electron beam source device comprising a field emission array having a plurality of emitters for generating electrons in vacuum under an electric field, wherein the field emission array contains an opening in its middle portion; and a cathode inside the electron beam source device configured so that the electrons from the field emission array collide with the cathode, wherein a portion of the cathode goes through the opening in the middle portion of the field emission array in a direction normal to a top surface of the field emission array.

2. The apparatus of claim 1, wherein the field emission array has a cross-section shape selected from a group consisting of a circle, a square and a regular polygon.

3. The apparatus of claim 1, wherein each of the plurality of emitters in the field emission array is a nanogap of at least one metal.

4. The apparatus of claim 3, wherein each of the plurality of emitters in the field emission array is disposed on a dielectric film.

5. The apparatus of claim 1, wherein each of the plurality of emitters in the field emission array comprises at least one carbon nanotube disposed in a void on a dielectric film.

6. The apparatus of claim 1, wherein each of the plurality of emitters in the field emission array is a Spindt array structure, the Spindt array structure comprising a plurality of metal cones, each disposed in a respective cylindrical void on a dielectric film.

7. The apparatus of claim 1, wherein the cathode is configured to emit secondary electrons.

8. The apparatus of claim 1, wherein the ionization chamber is configured to receive at least one dopant gas, and the electrons emitted from the field emission array and the secondary electrons emitted from the cathode collide with the at least one dopant gas for generating plasma comprising ionized dopants.

9. The apparatus of claim 8, further comprising an extraction apparatus for extracting the ionized dopants and forming an ion beam for ion implantation, wherein the extraction apparatus is connected with the ionization chamber.

10. An ion implantation equipment system, comprising:
an ion source apparatus for generating an ion beam during a process of ion implantation, the ion source apparatus comprising:
an ionization chamber configured to receive at least one dopant gas; and
an electron beam source device inside the ionization chamber, the electron beam source device comprising a field emission array having a plurality of emitters for generating electrons in vacuum under an electric field, wherein the field emission array contains an opening in its middle portion; and a cathode inside the electron beam source device configured so that the electrons from the field emission array collide with the cathode, wherein a portion of the cathode goes through the opening in the middle portion of the field emission array in a direction normal to a top surface of the field emission array.

11. The ion implantation equipment system of claim 10, wherein the field emission array has a cross-section shape selected from a group consisting of a circle, a square and a regular polygon.

12. The ion implantation equipment system of claim 10, wherein each of the plurality of emitters in the field emission array is a nanogap of at least one metal disposed on a dielectric film.

13. The ion implantation equipment system of claim 10, wherein each of the plurality of emitters in the field emission array comprises at least one carbon nanotube disposed in a void on a dielectric film.

14. The ion implantation equipment system of claim 10, wherein each of the plurality of emitters in the field emission array is a Spindt array structure, the Spindt array structure comprising a metal cone disposed in a cylindrical void on a dielectric film.

15. The ion implantation equipment system of claim 10, wherein the cathode emits secondary electrons.

16. The ion implantation equipment system of claim 10, wherein the field emission array and cathode are configured so that during use, electrons emitted from the field emission array and the secondary electrons emitted from the cathode collide with the at least one dopant gas for generating plasma comprising ionized dopants.

17. The ion implantation equipment system of claim 10, further comprising an extraction apparatus for extracting the ionized dopants and forming an ion beam for ion implantation, wherein the extraction apparatus is connected with the ionization chamber.

18. An ion generation method in a process of ion implantation, comprising:
feeding at least one dopant gas into an ionization chamber; and
generating electrons from an electron beam source device comprising a field emission array having a plurality of emitters in vacuum under an electric field, wherein the field emission array contains an opening in its middle portion; and a cathode inside the electron beam source device configured so that the electrons from the field emission array collide with the cathode, wherein a portion of the cathode goes through the opening in the middle portion of the field emission array in a direction normal to a top surface of the field emission array.

19. The ion generation method of claim 18, further comprising generating secondary electrons from a cathode in the electron beam source device by directing the electrons emitted from the field emission array toward the cathode; and generating plasma comprising ionized dopants by directing the secondary electrons from the cathode into the ionization chamber.

20. The ion generation method of claim 19, further comprising extracting the ionized dopants in the ionization chamber and forming an ion beam.

* * * * *